United States Patent
Jensen et al.

(10) Patent No.: US 6,549,443 B1
(45) Date of Patent: Apr. 15, 2003

(54) SINGLE EVENT UPSET RESISTANT SEMICONDUCTOR CIRCUIT ELEMENT

(75) Inventors: David W. Jensen, Cedar Rapids, IA (US); Steven E. Koenck, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 0 days.

(21) Appl. No.: 09/859,158

(22) Filed: May 16, 2001

(51) Int. Cl.[7] .............................................. G11C 11/00
(52) U.S. Cl. ............................. 365/56; 365/52; 365/63
(58) Field of Search ....................... 365/52, 63, 56, 365/72

(56) References Cited

U.S. PATENT DOCUMENTS

| | | | |
|---|---|---|---|
| 4,782,467 A | 11/1988 | Belt et al. | 365/154 |
| 4,785,200 A | 11/1988 | Huntington | 307/279 |
| 4,797,804 A | 1/1989 | Rockett, Jr. | 365/154 |
| 4,852,060 A | 7/1989 | Rockett, Jr. | 365/154 |
| 4,912,675 A | 3/1990 | Blake et al. | 365/154 |
| 4,992,981 A * | 2/1991 | Ganssloser | 365/63 |
| 4,996,445 A | 2/1991 | Lin | 307/272.3 |
| 5,031,180 A | 7/1991 | McIver et al. | 371/36 |
| 5,039,876 A | 8/1991 | Hochwald et al. | 307/278 |
| 5,046,044 A | 9/1991 | Houston et al. | 365/156 |
| 5,053,848 A | 10/1991 | Houston et al. | 357/51 |
| 5,111,429 A | 5/1992 | Whitaker | 365/156 |
| 5,175,605 A | 12/1992 | Pavlu et al. | 257/369 |
| 5,196,734 A | 3/1993 | Han | 307/247.1 |
| 5,204,990 A | 4/1993 | Blake et al. | 257/904 |
| 5,220,192 A | 6/1993 | Owens et al. | 257/519 |
| 5,267,218 A * | 11/1993 | Elbert | 365/52 |
| 5,307,142 A | 4/1994 | Corbett et al. | 365/156 |
| 5,311,070 A | 5/1994 | Dooley | 307/279 |
| 5,315,544 A | 5/1994 | Yokote et al. | 365/154 |
| 5,315,552 A * | 5/1994 | Yoneda | 365/63 |
| 5,321,658 A * | 6/1994 | Isnimura et al. | 365/63 |
| 5,379,247 A * | 1/1995 | Kuriyama et al. | 365/63 |
| 5,504,703 A | 4/1996 | Bansal | 365/156 |
| 5,525,923 A | 6/1996 | Bialas, Jr. et al. | 327/210 |
| 5,631,863 A | 5/1997 | Fechner et al. | 365/156 |
| 5,644,526 A * | 7/1997 | Mazzali | 365/63 |
| 5,898,619 A | 4/1999 | Chang et al. | 365/185.23 |
| 5,898,711 A | 4/1999 | Buer | 371/49.1 |
| 6,111,780 A | 8/2000 | Bertin | 365/154 |

* cited by examiner

*Primary Examiner*—Tan T. Nguyen
(74) *Attorney, Agent, or Firm*—Nathan O. Jensen; Kyle Eppele

(57) ABSTRACT

A single event upset (SEU) resistant semiconductor circuit element and a method of making are provided by the invention. The single event upset resistant semiconductor circuit element includes a plurality of parallel-connected semiconductor cell elements. Each semiconductor cell element of the plurality of parallel-connected semiconductor cell elements is physically separated from the other cell elements. Moreover, the semiconductor cell elements may be physically separated by at least one intervening semiconductor cell element of another circuit element.

20 Claims, 8 Drawing Sheets

SINGLE EVENT UPSET RESISTANT SEMICONDUCTOR CIRCUIT ELEMENT

FIELD OF THE INVENTION

The present invention relates generally to a single event upset resistant semiconductor circuit element, and more particularly to a single event upset resistant semiconductor circuit element formed of a plurality of parallel-connected semiconductor cell elements.

BACKGROUND OF THE INVENTION

A single event upset (SEU) is a type of electrical disturbance that can affect microelectronic devices. SEUs have multiple causes. In one instance, an SEU may be caused by a cosmic ray striking the microelectronic device. A cosmic ray is an exceedingly high energy particle from space. Cosmic rays consist mostly of protons but may also be heavier atomic nuclei. They may have energies of a billion electron volts (more energetic than many high energy particles created on earth in the most powerful particle accelerators), and are moving at nearly the speed of light. The earth's magnetic field deflects and its atmosphere absorbs most cosmic rays. Therefore, people and objects on the earth's surface are not highly affected. However, they do affect spacecraft and high-flying aircraft. Spacecraft and aircraft at high latitudes are more affected due to orientation of the earth's magnetic field.

In another instance, an SEU may be caused by an alpha particle striking the microelectronic device. Alpha particles are helium nuclei and are emitted from large atoms as a result of radioactive decay. Since the alpha particle does not contain any electrons, it has a positive charge. Alpha particles are typically present as low-level background radiation at the Earth's surface, and occur as a result of the decay of naturally occurring radioactive isotopes. A common source of alpha particles that may affect microelectronic devices is the minute amount of radioactive isotopes present in typical packaging materials.

Neutrons are another type of energetic particles that can affect electronic devices. Energetic neutrons are produced by nuclear reactions, collisions of protons with matter or by interactions between cosmic rays and the earth's atmosphere. Due to their lack of charge, they are able to deeply penetrate electronic devices, which can cause SEU effects in microelectronic devices.

Energetic particles th at strike microelectronic devices may adversely affect the operation of the electronic circuits. In particular, an energetic particle that hits a semiconductor memory cell element can cause the cell element to operate incorrectly, and can therefore cause the memory cell to change states (i.e., a single event upset or SEU). A memory cell corrupted by an energetic particle may cause severe problems, such as improper operation of a computer using an affected memory. For example, if a memory state change occurs in a critical memory component such as a processor program or data stack, the CPU may operate improperly after accessing the stack. It should be noted that although the effects of energetic particles on semiconductor memory cells are the most troublesome because the effect of an SEU disturbance may be "held" for some time, energetic particles in other circuitry also may be problematic. For instance, if a transistor in a combinational logic device is hit by radiation at a critical time, the logic device output may be affected and the output change may cause an error, which may be propagated through any subsequent circuitry.

An SEU typically is caused by electron-hole pairs created by, and along the path of, an energetic particle as it passes through a semiconductor device such as a memory cell. If the energetic particle generates a sufficient amount of charge in a critical volume of a semiconductor circuit element, then the logic state of the semiconductor circuit element may be corrupted. Either N-channel or P-channel Metal Oxide Semiconductor Field Effect Transistors (MOSFETs) may be upset by an energetic particle. The primary upset condition of concern is for an "off" device to be momentarily turned "on" by the generated charge.

FIG. 1 shows a representative metal-oxide-semiconductor (MOS) N-channel enhancement mode MOSFET and its schematic symbol. The N-channel MOSFET has a gate terminal G, a source terminal S, and a drain terminal D. The gate controls a channel region between the source and drain such that current flows in the device when the gate voltage is sufficiently positive with respect to the source terminal. When an energetic particle "R" strikes the semiconductor material, it may generate electron-hole pairs as shown by the respective positive and negative symbols. As can be seen from the figure, when the energetic particle "R" passes through the device, it may cause regions of accumulated negative and positive charge which may mimic the affect of gate voltage. Therefore, the energetic particle may momentarily affect operation of the transistor and may cause the transistor to effectively be biased "on".

FIG. 2 shows a P-channel MOSFET and its schematic symbol. In contrast to the N-channel MOSFET, the P-channel MOSFET source and drain reside in an N-well, which provides electrical isolation and the appropriate semiconductor material polarity for fabrication of the complementary P-channel MOSFET co-resident with N-channel MOSFETs. As with the N-channel MOSFET, an energetic particle can affect the P-channel MOSFET and may bias the transistor "on". It should be noted that an energetic particle strike in the N-well region may also cause undesirable effects that result in a transistor malfunction.

N-channel and P-channel MOSFETs are used together to implement Complementary Metal Oxide Semiconductor (CMOS) circuits that are well known in the art. An example basic CMOS circuit is illustrated in FIG. 3 which shows a prior art inverter and its typical schematic symbol. The prior art inverter is composed of a P-channel MOSFET and an N-channel MOSFET connected as shown. If the input is at a high voltage level (i.e., a logic one), the P-channel MOSFET will be biased off while the N-channel MOSFET will be biased on. The P-channel MOSFET will act as essentially an open switch and the N-channel MOSFET will act as a closed switch in series with a small resistance connected to ground. Therefore the output will be a low voltage level (off, or a logic zero). Conversely, if the input is low, the P-channel MOSFET will be biased on and the N-channel will be biased off. The N-channel MOSFET will therefore act as an open switch and the P-channel MOSFET will act as a closed switch in series with a small resistance connected to $V_{DD}$. The inverter output will therefore be a high voltage level (on, or a logic one). A significant benefit of the CMOS circuit topology is that in either static logic state, no current flows from $V_{DD}$ to ground, so the power consumption is extremely low.

FIG. 4 shows a graph of the output voltage of the prior art inverter during an SEU occurrence where the N-channel MOSFET is biased off and the output of the prior art inverter is at a high voltage level. Upon a strike by an energetic particle, the N-channel MOSFET may be momentarily biased on. The result is a condition where both MOSFETs are biased on, and a voltage division occurs, represented by FIG. 3A with both switches closed. The output voltage in the prior art inverter may swing towards about one-half of the supply voltage $V_{DD}$, placing the output voltage at an indeterminate level for a period of time. Therefore, the output may change state, and may even oscillate between output states (the threshold voltage of one-half $V_{DD}$ is typically a decision level below which the output is a logic zero and above which the output is a logic one). This is an undesirable condition and may lead to other errors.

FIG. 5 shows a prior art memory cell formed of two inverters. A logic one on the input will be inverted twice, producing a logic one at the output. This regenerative positive feedback results in persistent storage of the input state in the circuit. Any disturbance to this memory cell that causes the stored state to be altered will appear on the output and will be persistently stored.

FIG. 6 shows a prior art master-slave D flip-flop circuit of the type that is typically implemented in a CMOS semiconductor process using N-MOSFET and P-MOSFET transistors as previously described. The circuit comprises multiple coupled inverters and transmission gates, with the transmission gates being used to gate signals responsive to specific clock levels. The output of the first pair of coupled inverters is coupled into the second pair of inverters. The action of the circuit is to capture the state of the logic signal present on the D input with the rising edge of the CLK control and to store that state persistently. An SEU occurrence in either of the coupled inverter sections may cause the stored state of the flip-flop to be changed leading to an error condition.

FIG. 7 shows a typical 1 micrometer (micron) scale MOSFET. The MOSFET includes a gate G with a pair of contacts, a source S, and a drain D. The figure shows an approximate size of an energetic particle strike region in relation to the 1 micron transistor. This size approximation is based upon the likelihood of an SEU occurrence in a 1 micron transistor as compared to the likelihood of an SEU occurrence in a 0.25 micron scale transistor. A semiconductor cell element of this size, when hit by an energetic particle, is typically not affected. Older and larger semiconductor designs were therefore inherently more SEU resistant, and could generally absorb an energetic particle strike without any state change. It can be appreciated from the figure that as the scale of individual transistors shrink, an entire transistor or multiple transistors may fall within an energetic particle strike region. The increasing miniaturization of transistors therefore leads to an increasing possibility of erroneous outputs and faulty circuit operation.

FIG. 8 shows a typical prior art P-channel MOSFET configuration wherein a number of P-channel transistors are fabricated in an N-well. This allows for a certain efficiency of physical circuit layout, as P-channel MOSFETs may be placed on the same lateral pitch as the corresponding N-channel MOSFETs to implement the coupled inverter or other circuit configurations. It is apparent from the figure that an energetic particle strike within the shared N-well may affect many transistors therein.

In memory arrays having large quantities of semiconductor circuit elements, such as a general purpose storage memory, an SEU occurrence may be detected and corrected by applying some form of error detection and correction (i.e., parity, block codes, cyclic codes, etc.). Once an error in an affected semiconductor circuit element is detected, it can be restored to an initial state by a subsequent write operation.

In an attempt to address the deficiencies of the redundant semiconductor circuit element approach, the prior art has employed a voting approach. The voting approach employs multiple semiconductor circuit elements, with a typical number of three such redundant elements. For a memory read operation, the state of each circuit element is read and compared with a majority vote of the multiple circuit elements governing the overall state of the redundant circuit. Using voting, the circuit can detect an error, and can correct it by rewriting the affected circuit element with the data determined by the other redundant circuit elements. An example prior art voting circuit is taught by McIver et al in U.S. Pat. No. 5,031,180.

A drawback of the prior art voting approach is that it requires additional logic circuitry or microprocessor attention to perform the voting function and to couple the voted result to the output of the circuit element. The additional logic circuitry will more than triple the physical size of the circuit element. The speed of the logic function of the circuit element will also be degraded by the addition of circuitry that signals must propagate through from input to output. As such, the voting process therefore increases the time required to access the memory.

Registers are small sets of memory that are repeatedly used by a CPU in order to process data. A main advantage of register memory is its generally fast access speed. A typical use is to process CPU instructions and to hold portions of general memory contents for data manipulation. Because of the need to maintain high access speeds, applying block codes to a register memory is therefore not practical. The decode logic for these block codes would unacceptably degrade the access speed.

What is needed, therefore, are improvements to semiconductor circuit elements to make them resistant to upsets caused by energetic particles.

SUMMARY OF THE INVENTION

According to a first embodiment of the invention, a single event upset resistant semiconductor circuit element includes a plurality of parallel-connected semiconductor cell elements. Each semiconductor cell element of the plurality of parallel-connected semiconductor cell elements is physically separated from a nearest semiconductor cell element of the circuit element.

According to a second embodiment of the invention, a single event upset resistant semiconductor circuit element system includes a plurality of parallel-connected semiconductor cell elements arranged in a predetermined pattern of interleaved, spaced-apart semiconductor cell elements. Any two semiconductor cell elements of one circuit element of the system have positioned there between at least one intervening semiconductor cell element of another circuit element of the system.

According to another aspect of the invention, a method of forming a single event upset resistant circuit element comprises the step of forming a first parallel-connected semiconductor cell element of the semiconductor circuit element. The method further comprises the step of forming a second parallel-connected semiconductor cell element spaced apart from the first parallel-connected semiconductor cell element. The semiconductor circuit element is formed of a plurality of spaced semiconductor cell elements.

The above and other features and advantages of the present invention will be further understood from the following description of the preferred embodiments thereof, taken in conjunction with the accompanying drawings.

DETAILED DESCRIPTION

Figure 1:
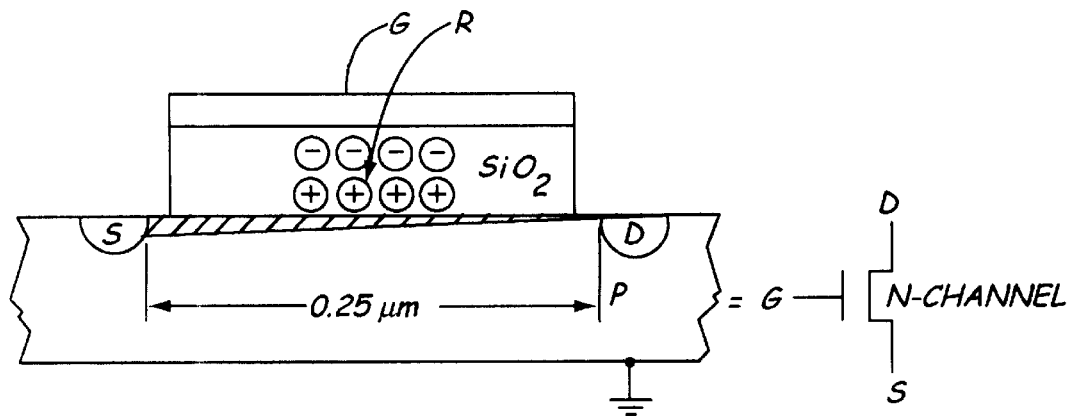
FIG. 1 shows an N-channel MOSFET and its symbol.
Figure 2:
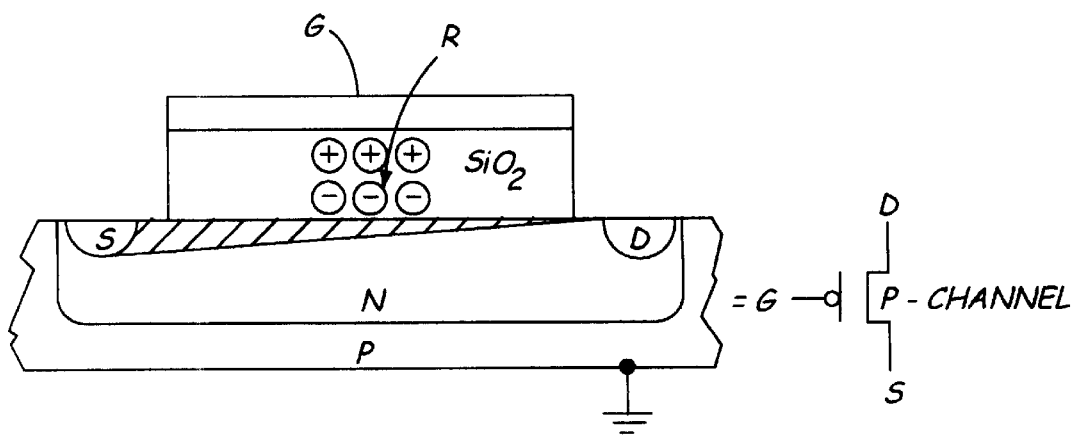
FIG. 2 shows a P-channel MOSFET and its symbol.
Figure 3A:
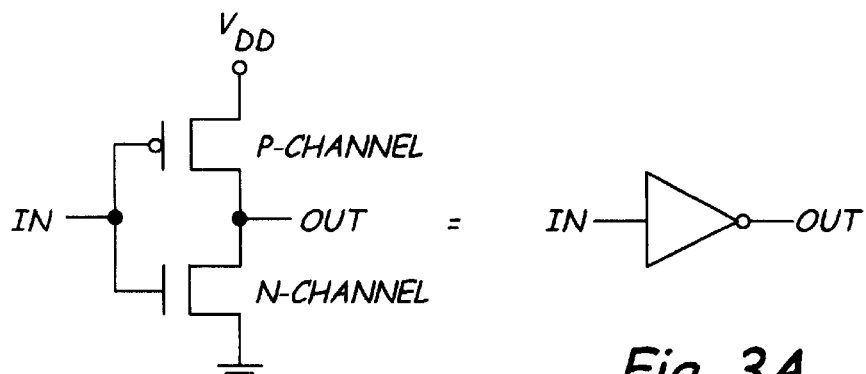
FIG. 3A shows an equivalent electrical circuit for the prior art inverter.
Figure 3B:
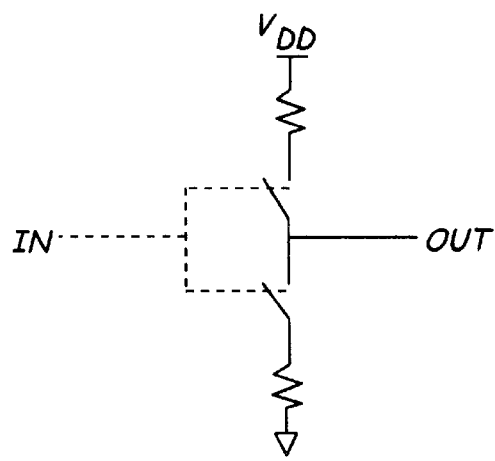
FIG. 3 shows a prior art inverter and a symbol for the inverter.
Figure 4:
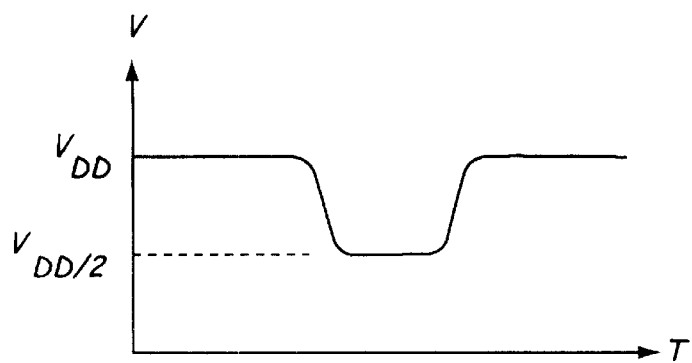
FIG. 4 shows a voltage output graph for the prior art inverter during an SEU occurence.
Figure 5:
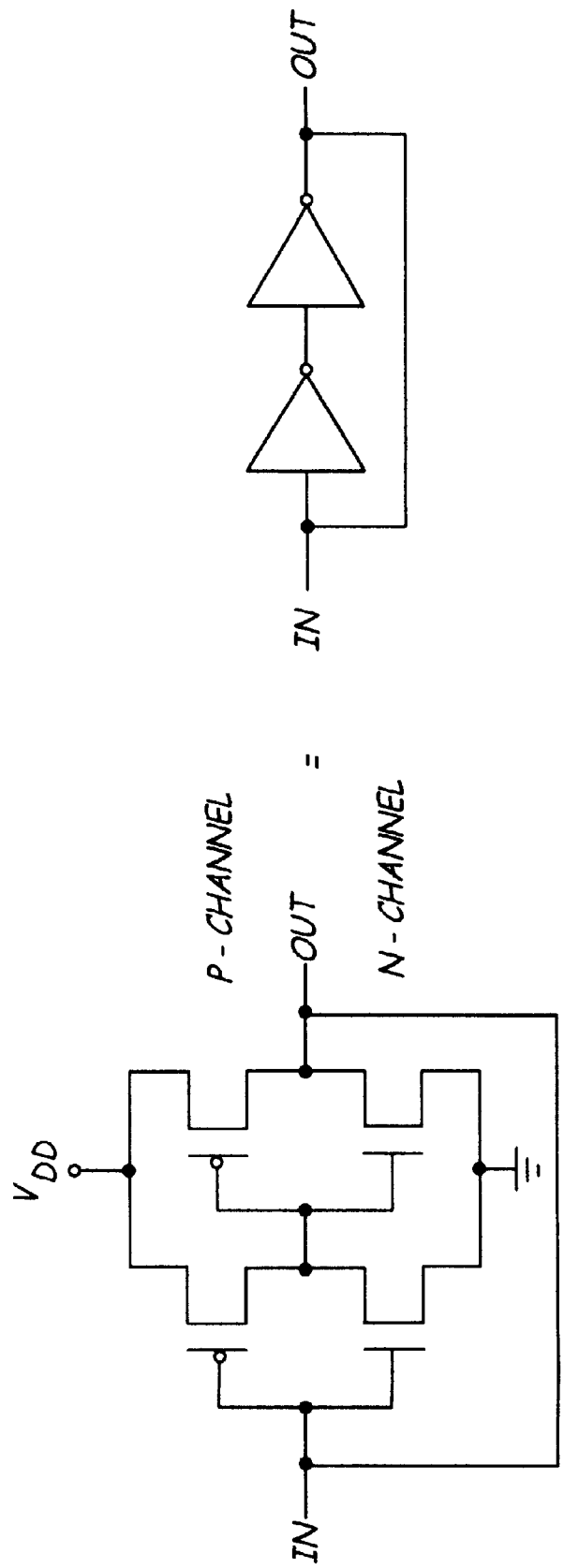
FIG. 5 shows a prior art memory cell formed of two inverters.
Figure 6:
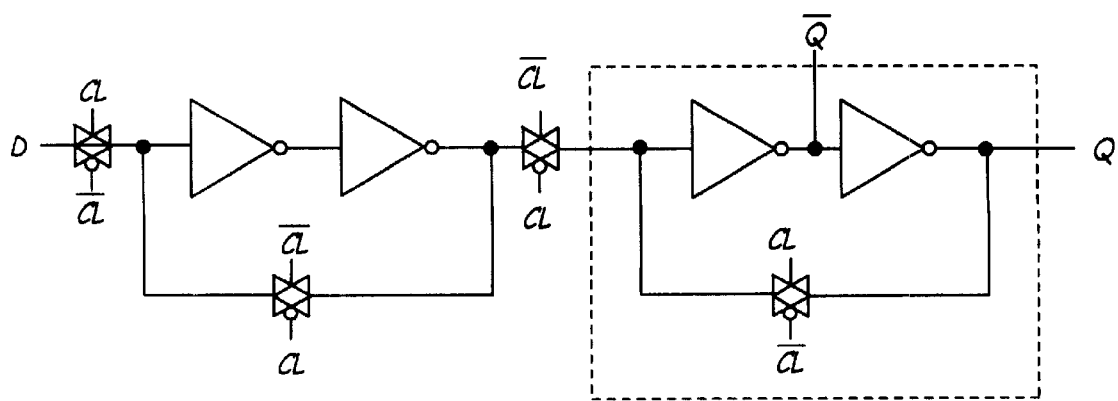
FIG. 6 shows a D flip-flop that comprises multiple coupled inverters and transmission gates, with the transmission gates being used to gate signals responsive to specific clock levels.
Figure 7:
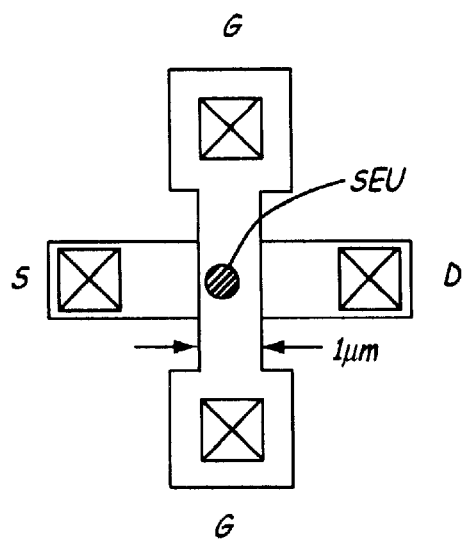
FIG. 7 shows a typical 1 micrometer scale MOSFET.
Figure 8:
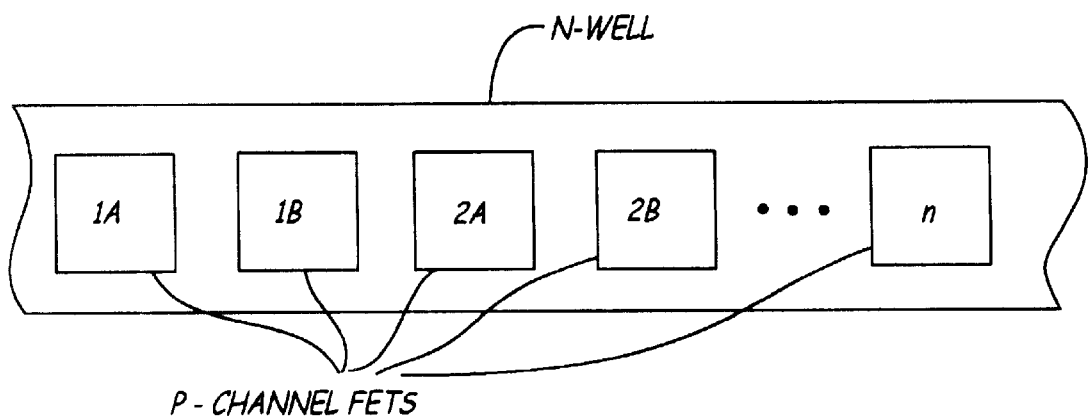
FIG. 8 shows a typical prior art P-channel MOSFET configuration wherein a number of P-channel transistors are fabricated in an N-well.
Figure 9:
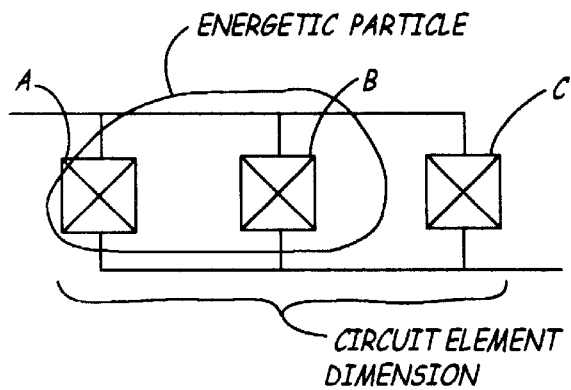
FIG. 9 shows a semiconductor circuit element arrangement according to a first embodiment of the invention.

FIG. 9 shows a semiconductor circuit element arrangement according to a first embodiment of the invention. This embodiment employs a white space separation between the cell elements. In this embodiment, a semiconductor circuit element is formed of three parallel-connected semiconductor cell elements A, B, and C. Although three cell elements are shown in the figure, it should be understood that any multiple number of semiconductor cell elements may be used, including two. No voting is performed, and all of the parallel-connected cell elements perform an identical function.

The SEU resistance of the invention is provided by ensuring that not all of the cell elements are likely to be affected by a single energetic particle. The white space between the elements must be large enough so that the region of influence of an energetic particle does not affect all of the elements. In FIG. 9, the semiconductor circuit element dimension is at least as large as an energetic particle region of influence dimension. Circuit element dimensions decrease with smaller semiconductor fabrication dimensions; however, the region of influence dimension of the energetic particle remains relatively constant. The spacing between cell elements would become proportionately bigger in FIG. 9 with decreasing cell element dimensions. This scaling allows design of a semiconductor circuit element to accommodate any expected dimension of an energetic particle and future decreases in fabrication dimensions.

A semiconductor cell element as used here is meant to encompass any cell formed of semiconductor devices, including those having two or more terminals and at least one semiconductor junction. A semiconductor circuit element may therefore be formed of transistors, transistors plus resistors, diodes, capacitors, etc., transistor pairs, transmission gates, inverter pairs, etc. In addition, a semiconductor circuit element includes any type of digital logic gates, such as AND/NAND gates, OR/NOR gates, exclusive OR gates, inverters, buffers, flip-flops, latches, etc.

Moreover, a semiconductor circuit element may have any type of function, and may therefore be a memory or register cell, a comparator, an amplifier, etc., or may be a discrete component such as a diode, resistor, capacitor, etc.

The three semiconductor cell elements A, B, and C shown in this embodiment are parallel-connected in that their inputs and outputs are interconnected. Other interconnections (not shown) may also exist, such as common power and ground traces. Each cell element may be a complete sub-unit of the circuit element, such as, for example, a complete digital memory element capable of storing a logic zero or a logic one. The type of transistor devices and other devices used to construct the memory cell are not critical to the invention, and any device configuration may be used to construct a memory cell.

Figure 10:
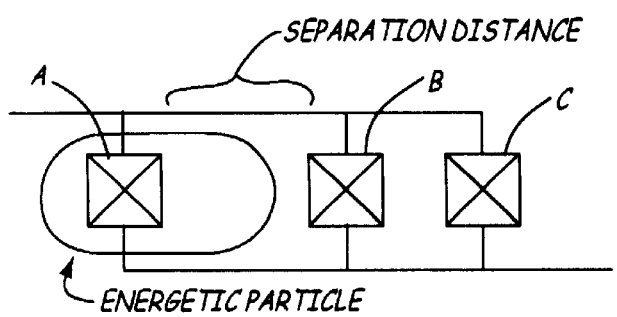
FIG. 10 shows a semiconductor circuit element according to a second embodiment of the invention.

FIG. 10 shows a semiconductor cell element according to a second embodiment of the invention. In the second embodiment, the cell elements are also separated by a white space. However, in this embodiment a cell element separation distance between adjacent semiconductor cell elements is at least an energetic particle region of influence dimension. The cell elements therefore are far enough apart to ensure that an energetic particle cannot simultaneously affect two adjacent semiconductor cell elements.

It should be understood that other white space sizes may be used as desired. The size of the white space may be selected of any dimension large enough to ensure that a circuit element is not affected by an energetic particle.

Figure 11:
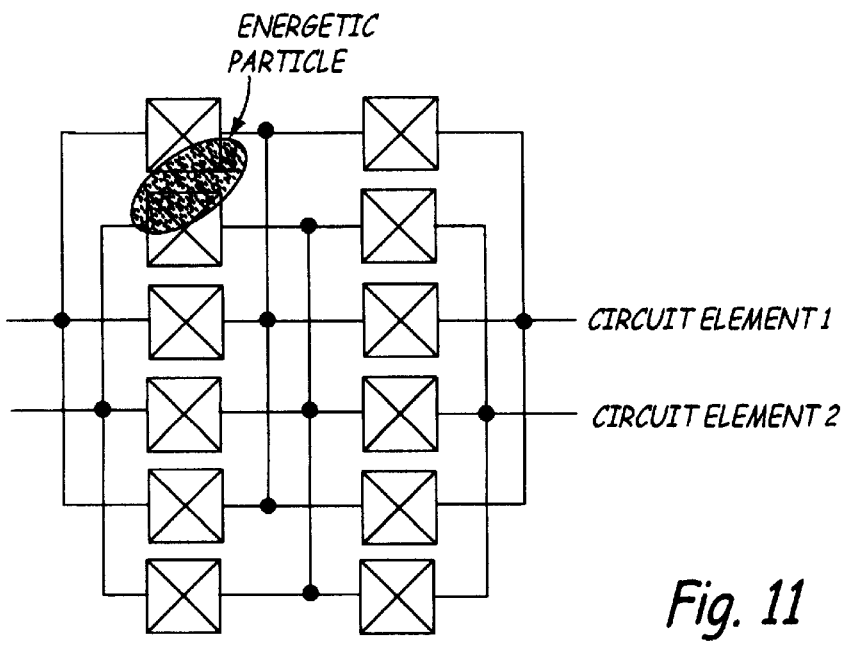
FIG. 11 shows a semiconductor circuit element according to a third embodiment of the invention.

FIG. 11 shows a semiconductor circuit element according to a third embodiment of the invention. In this embodiment, the cell elements of circuit element 1 are interleaved with cell elements of circuit element 2. However, the parallel-connected cell elements are not adjacent to each other. Moreover, the semiconductor cell elements are physically separated by at least one intervening semiconductor cell element of another circuit element. This physical distance between the elements is accomplished without increasing an overall area used by each semiconductor circuit element (other than the area required for the redundant cell elements).

The intervening elements do not have to be memory elements or transistor devices, and could alternatively be other cell elements such as buffer elements, resistive or capacitive elements, etc. However, for purposes of semiconductor device density and efficiency, they will likely be similar in form and function.

As is typically done in the art, the interconnection traces between elements may be placed on a physical level above the cell elements themselves, with an insulator or dielectric layer in between. A via may vertically connect an interconnection trace to a cell element input or output pad. Therefore, the traces between the semiconductor cell elements of circuit element 1, for example, do not physically contact the intervening semiconductor cell elements of circuit element 2.

The intervening semiconductor cell elements may be linearly arranged, as shown, or alternatively may be arranged in a stair-step fashion. In a stair-step arrangement, a first adjacent intervening semiconductor cell element is located a predetermined horizontal and a vertical distance from the semiconductor cell element. Likewise, a second adjacent intervening semiconductor cell element may be located a predetermined horizontal and vertical distance below the first adjacent intervening cell element. An entire register memory or cache memory, for example, may be formed in this pattern, with the invention allowing the memory cells (or other circuit elements) to be efficiently compressed into a small area. The semiconductor cell element placement of the invention therefore maintains a reduced size memory, using microelectronic semiconductor cell elements, while improving the performance and robustness of the individual semiconductor circuit elements without the need for extra circuitry or extra access time.

Figure 12:
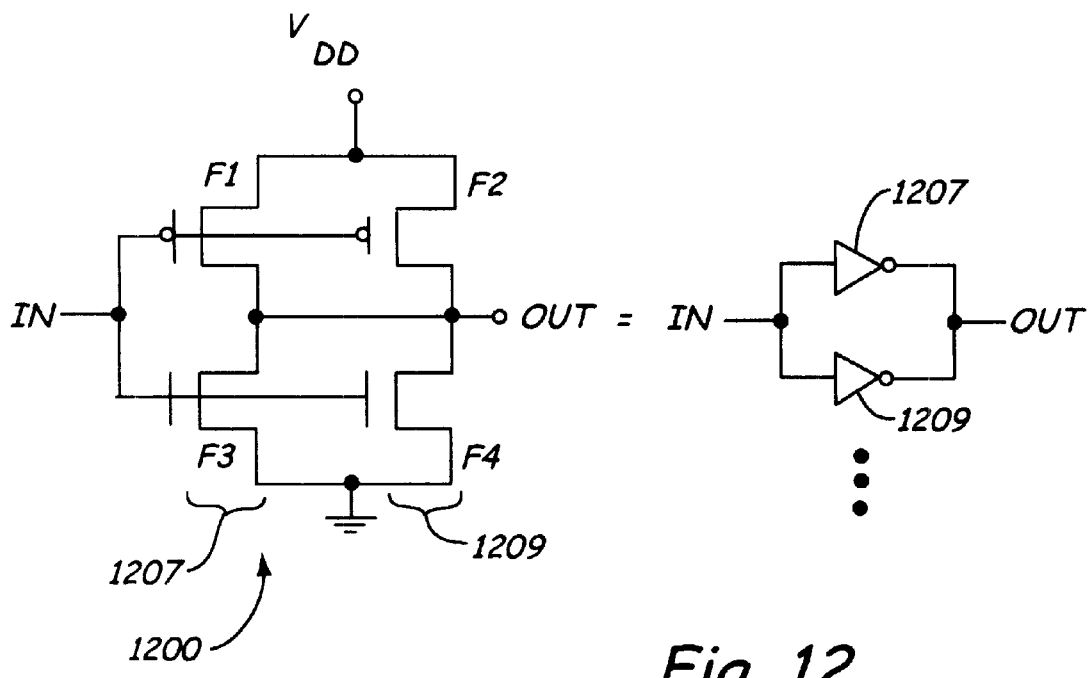
FIG. 12 shows a n inverter constructed according to the invention.

FIG. 12 shows an inverter 1200 constructed according to the invention. The inverter 1200 includes at least two parallel-connected inverters 1207 and 1209. Because the inverter 1200 is constructed of at least two physically separated inverter cell elements, an energetic particle may not affect both. If more than two cell elements are employed, the resistance to an energetic particle is increased.

Figure 13:
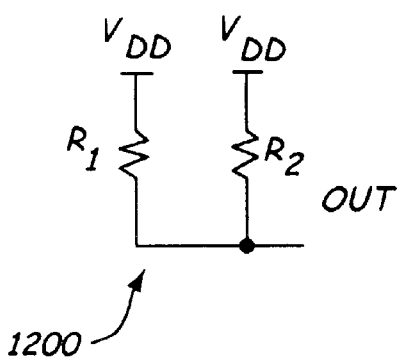
FIG. 13 shows an equivalent circuit for the inverter, showing how the MOSFETs may be modeled by resistances and open switches when biased in the on and off states respectively.

FIG. 13 shows an equivalent circuit 1200 for the inverter 1200, showing how the MOSFETs may be modeled by resistances and open switches when biased in the on and off state respectively. The MOSFETs F1–F4 may therefore be depicted as resistors R1–R4. It is assumed that the resistances R1–R4 are approximately equal. During normal operation with MOSFETs F1–F2 biased on and MOSFETs F3–F4 biased off, the equivalent circuit is shown in FIG. 13. The output is therefore the supply voltage $V_{DD}$.

Figure 14:
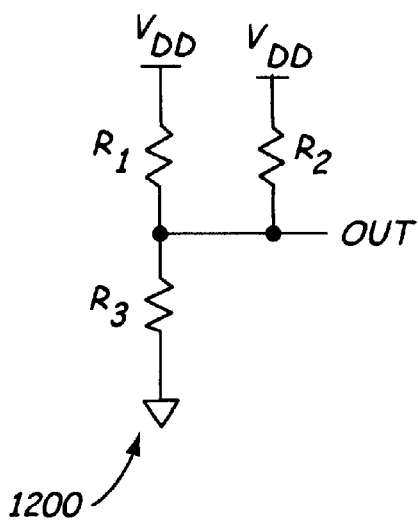
FIG. 14 shows the equivalent resistor circuit if MOSFET F3 has been temporarily biased into an on state by an energetic particle.

FIG. 14 shows the equivalent resistor circuit if MOSFET F3 has been temporarily biased into an on state by an energetic particle. Now, instead of the output being $V_{DD}$, a voltage divider is created and the output voltage is therefore two-thirds $V_{DD}$.

Figure 15:
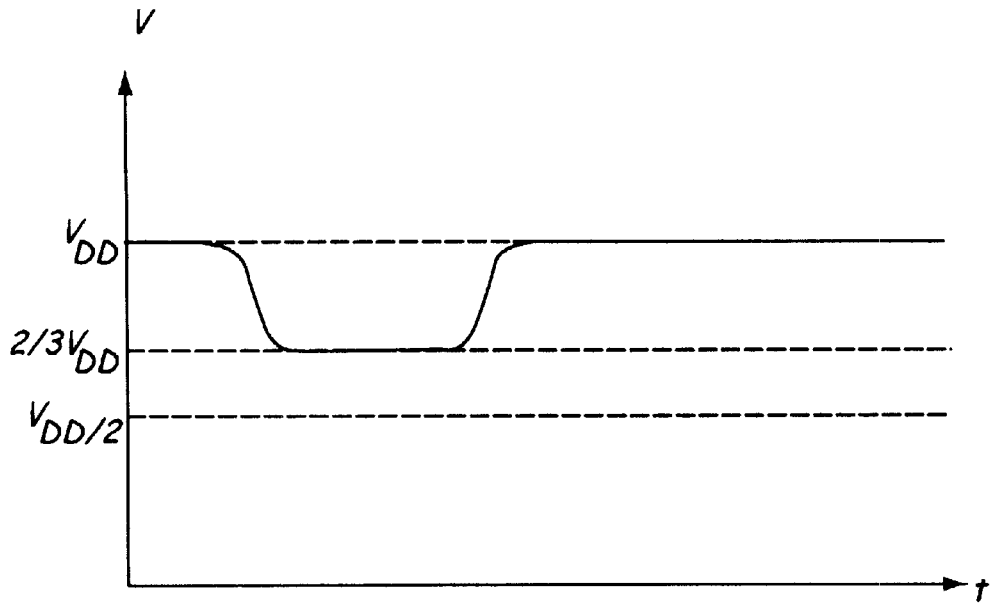
FIG. 15 is an output voltage graph for the output of the inverter during an energetic particle strike.

FIG. 15 is an output voltage graph for the output of the inverter during an energetic particle strike. The output voltage remains safely above the threshold one-half $V_{DD}$ region. Therefore, the output voltage avoids being in an indeterminate state due to the effects of an energetic particle. If more than two parallel-connected inverters are employed for the inverter circuit element, the safety margin above the indeterminate voltage level may be further increased.

Figure 16:
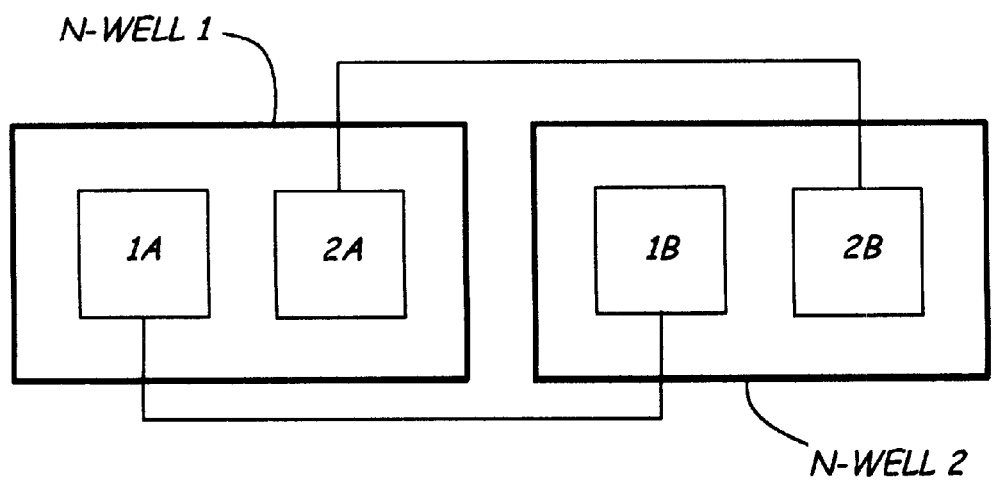
FIG. 16 shows a semiconductor circuit element configuration according to a fourth embodiment of the invention.

FIG. 16 shows a semiconductor circuit element configuration according to a fourth embodiment of the invention. In this embodiment, multiple P-channel MOSFETs 1A, 1B, and 2A, 2B, etc., are formed in separated and isolated N-wells. However, unlike the prior art, a semiconductor cell element in one well is parallel connected to a semiconductor cell element in a separate well so that an energetic particle strike in one N-well will not affect all of the cell elements of a circuit element. The cell elements are therefore distributed among separated and isolated N-wells.

In addition to the cell element arrangement of the invention, a semiconductor circuit element or cell elements may be radiation hardened or otherwise designed and manufactured to be resistant to energetic particles. The cell elements may contain SEU prevention devices or elements, such as extra transistors, resistors, diodes, capacitors, etc. The cell elements may contain integral semiconductor guard structures. A semiconductor cell thus designed may give an extra level of assurance that the circuit element will not be adversely affected in the event of an energetic particle strike.

A semiconductor circuit element of the invention may be, among other things, any type of memory. This may include a random access memory (RAM) cell, including static and dynamic RAM, or may be a read-only memory (ROM) cell. In addition, the arrangement of the semiconductor cell elements may be employed for any other type of semiconductor circuit elements that employ semiconductor junctions, such as diodes, for example. The semiconductor circuit element arrangement of the invention may be used in any situation where radiation corruption may be a problem.

An advantageous feature of the invention is that the semiconductor cell elements may be placed farther and farther apart as semiconductor technology improves and as transistor sizes continue to shrink. In this invention, the spacing between the semiconductor cell elements is at least as large as the region of influence dimension of an energetic particle. If only two intervening devices are needed between semiconductor cell elements for 0.25 micrometer transistors, then as the transistors or cell elements shrink, additional intervening semiconductor cell elements may be employed in order to maintain the predetermined distance between individual semiconductor cell elements. This scaling provides a method to efficiently use the "white space" between cells and maintain the region of influence dimension constraint.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A single event upset (SEU) resistant semiconductor circuit element, comprising a plurality of parallel-connected semiconductor cell elements, with each semiconductor cell element of said plurality of parallel-connected semiconductor cell elements being physically separated from a nearest semiconductor cell element of said circuit element, wherein the parallel-connected semiconductor cell elements include two or more terminals and at least one semiconductor junction, the two or more terminals of one parallel-connected semiconductor element being connected to the two or more terminals of another parallel-connected semiconductor element in parallel, the two or more terminals including an input and an output.

2. The semiconductor circuit element of claim 1, wherein a semiconductor cell element of said plurality of parallel-connected semiconductor cell elements is physically separated from a nearest semiconductor cell element of said circuit element by at least one intervening external semiconductor cell element.

3. The semiconductor circuit element of claim 1, wherein a cell element separation distance between adjacent semiconductor cell elements comprises at least an energetic particle region of influence dimension.

4. The semiconductor circuit element of claim 1, wherein a total semiconductor circuit element dimension comprises at least an energetic particle region of influence dimension.

5. The semiconductor circuit element of claim 1, wherein said plurality of parallel-connected semiconductor cell elements comprise memory cells.

6. The semiconductor circuit element of claim 1, wherein said plurality of parallel-connected semiconductor cell elements comprise inverters.

7. The semiconductor circuit element of claim 1, wherein said plurality of parallel-connected semiconductor cell elements comprise D flip-flops.

8. A single event upset (SEU) resistant semiconductor circuit element, comprising a plurality of parallel-connected semiconductor cell elements, with each semiconductor cell element of said plurality of parallel-connected semiconductor cell elements being physically separated from a nearest semiconductor cell element of said circuit element, wherein a semiconductor cell element of said plurality of parallel-connected semiconductor cell elements is physically separated form a nearest semiconductor cell element of said circuit element by at least one intervening external semiconductor cell element and said at least one intervening external semiconductor cell element is part of a second semiconductor circuit element.

9. A single event upset (SEU) resistant semiconductor circuit element, comprising a plurality of parallel-connected semiconductor cell elements, with each semiconductor cell element of said plurality of parallel-connected semiconductor cell elements being physically separated from a nearest semiconductor cell element of said circuit element, wherein a first cell element of said plurality of parallel-connected semiconductor cell elements is in a first isolating well and a second cell element is in a second isolating well.

10. A single event upset (SEU) resistant semiconductor circuit element system, comprising a plurality of parallel-connected semiconductor cell elements arranged in a predetermined pattern of interleaved, spaced-apart semiconductor cell elements wherein any two semiconductor cell elements of one circuit element of said system have positioned there between at least one intervening semiconductor cell element of another circuit element of said system.

11. The semiconductor circuit element system of claim 10, wherein a cell element separation distance between adjacent semiconductor cell elements comprises at least an energetic particle region of influence dimension.

12. The semiconductor circuit element system of claim 10, wherein a total semiconductor circuit element dimension comprises at least an energetic particle region of influence dimension.

13. The semiconductor circuit element system of claim 10, wherein a first cell element of said plurality of parallel-connected semiconductor cell elements is in a first isolating well and a second cell element is in a second isolating well.

14. The semiconductor circuit element system of claim 10, wherein said plurality of parallel-connected semiconductor cell elements comprise memory cells.

15. The semiconductor circuit element system of claim 10, wherein said plurality of parallel-connected semiconductor cell elements comprise inverters.

16. The semiconductor circuit element system of claim 10, wherein said plurality of parallel-connected semiconductor cell elements comprise D flip-flops.

17. A method of forming a single event upset (SEU) resistant semiconductor circuit element, comprising the steps of:

forming a first parallel-connected semiconductor cell element of said semiconductor circuit element having a first input and a first output; and forming a second-parallel-connected semiconductor cell element having a second input and a second output, the second-parallel-connected semiconductor cell element being spaced apart from said first parallel-connected semiconductor cell element;

wherein said semiconductor circuit element is formed of a plurality of spaced apart semiconductor cell elements, wherein the first input is coupled to the second input and the first output is coupled to the second output.

18. The method of claim 17, wherein a cell element separation distance formed between said first and second semiconductor cell elements of said semiconductor circuit element comprises at least an energetic particle region of influence dimension.

19. The method of claim 17, wherein a total semiconductor circuit element dimension comprises at least an energetic particle region of influence dimension.

20. The method of claim 17, further comprising the step of forming at least one intervening semiconductor cell element between said first and second parallel-connected semiconductor cell elements of said semiconductor circuit element.

* * * * *